United States Patent [19]

Gratke

[11] Patent Number: 4,920,342
[45] Date of Patent: Apr. 24, 1990

[54] MEMBRANE SWITCHCORES WITH HIGH RESISITIVITY INK CIRCUITS

[75] Inventor: Norman G. Gratke, Elm Grove, Wis.

[73] Assignee: W. H. Brady Co., Milwaukee, Wis.

[21] Appl. No.: 262,568

[22] Filed: Oct. 25, 1988

[51] Int. Cl.[5] ............................................ H03M 11/00
[52] U.S. Cl. ........................................ 341/22; 341/33;
200/5 A; 200/600; 200/292
[58] Field of Search .............................. 341/22, 26, 33;
178/17 C; 200/5 A, 159 B, 292, 600, 52 R;
361/288, 290; 400/477, 479, 479.1, 491

[56] References Cited

U.S. PATENT DOCUMENTS 4,633,228  12/1986  Larson ................................. 341/26
4,803,315   2/1989  Kako et al. ........................... 341/33
4,857,684   8/1989  Gratke ................................. 341/33

Primary Examiner—Donald J. Yusko
Assistant Examiner—Tyrone Queen
Attorney, Agent, or Firm—Quarles & Brady

[57] ABSTRACT

A decodable alphanumeric membrane switchcore (12, 12a, 12b,100) of at least 36 key cells (55,122) including spaced circuits (16,17;105,115) having row and column traces (20-34, 40-47,51;106,116) and key cell elements (37,38,49;80;107,117) printed with ink having a resistivity of at least about 10 ohms per square per 0.001" of ink thickness and having at least one path defined by a row trace, column trace and a key cell that has a resistance greater than 10,000 ohms.

5 Claims, 8 Drawing Sheets

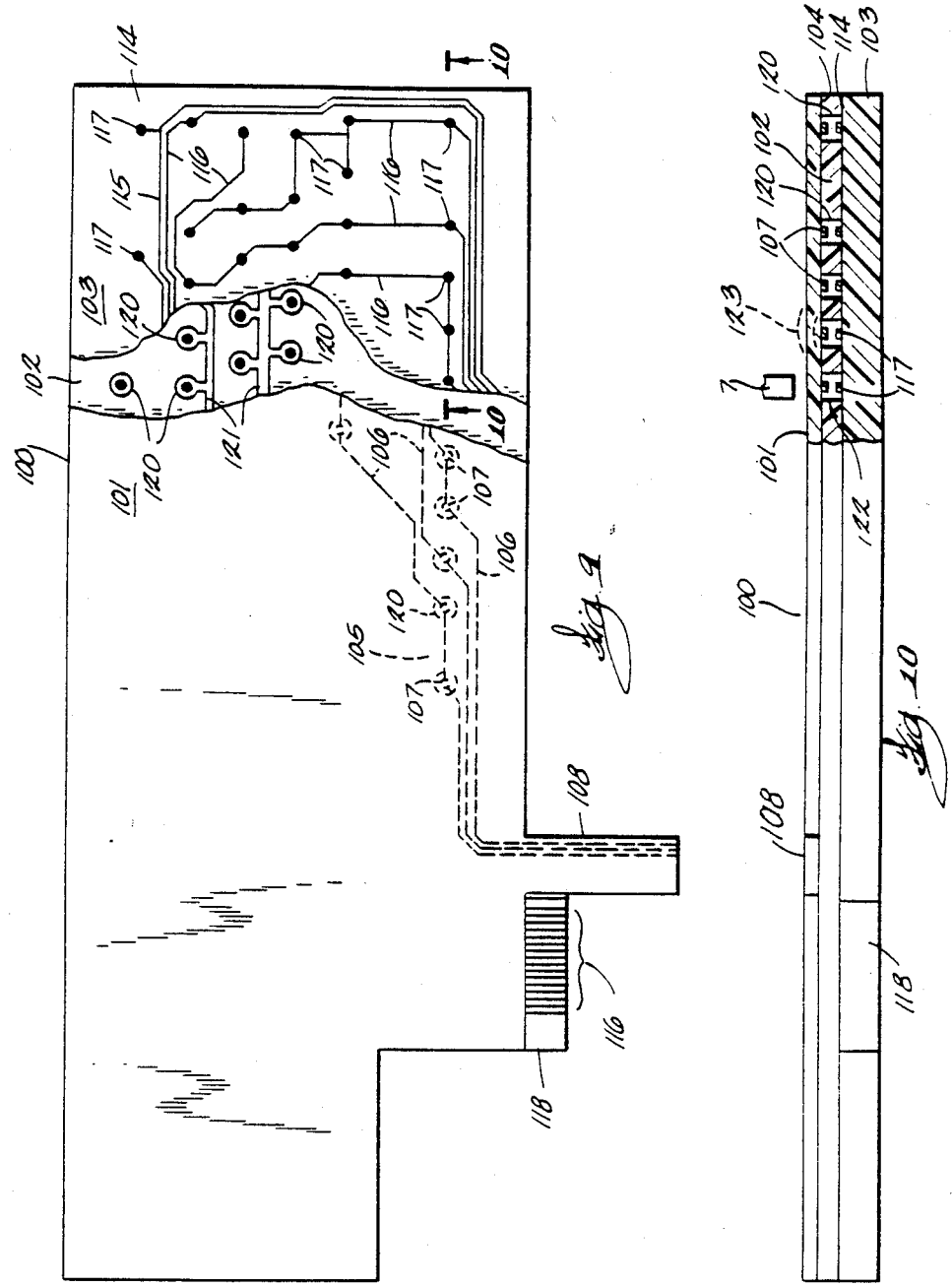

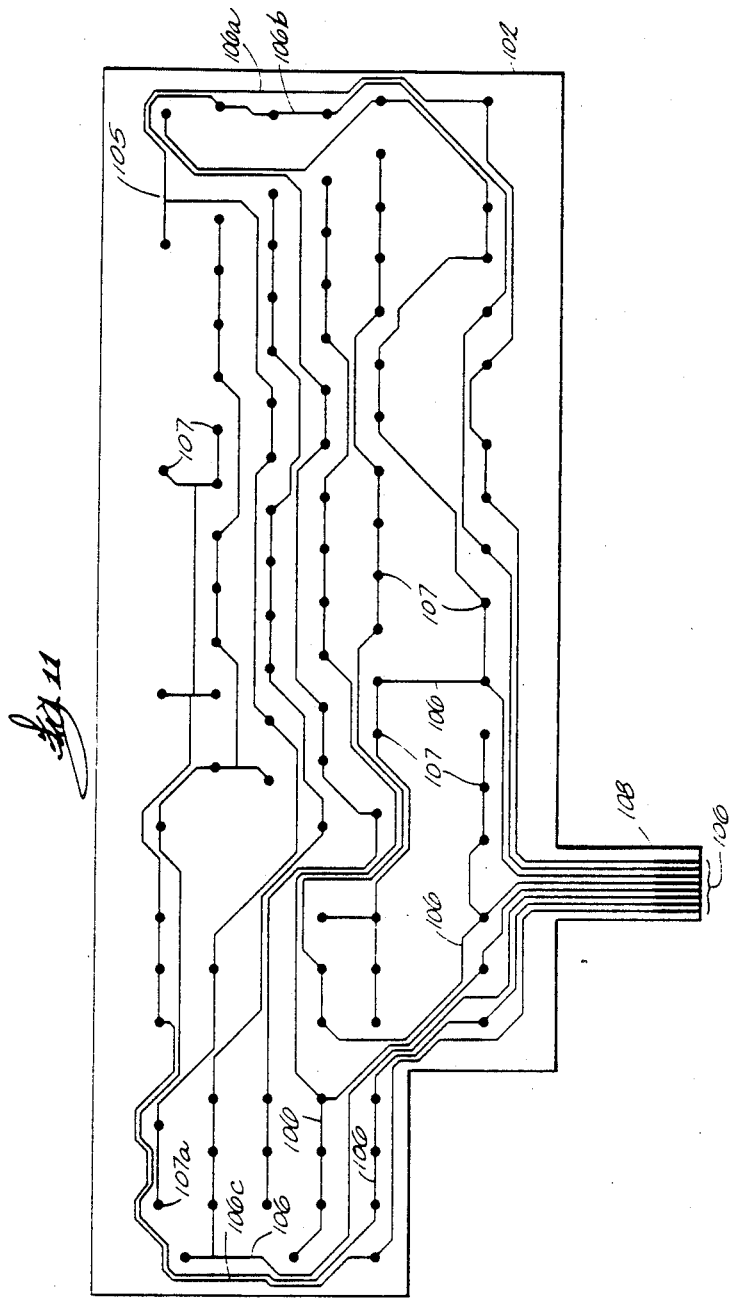

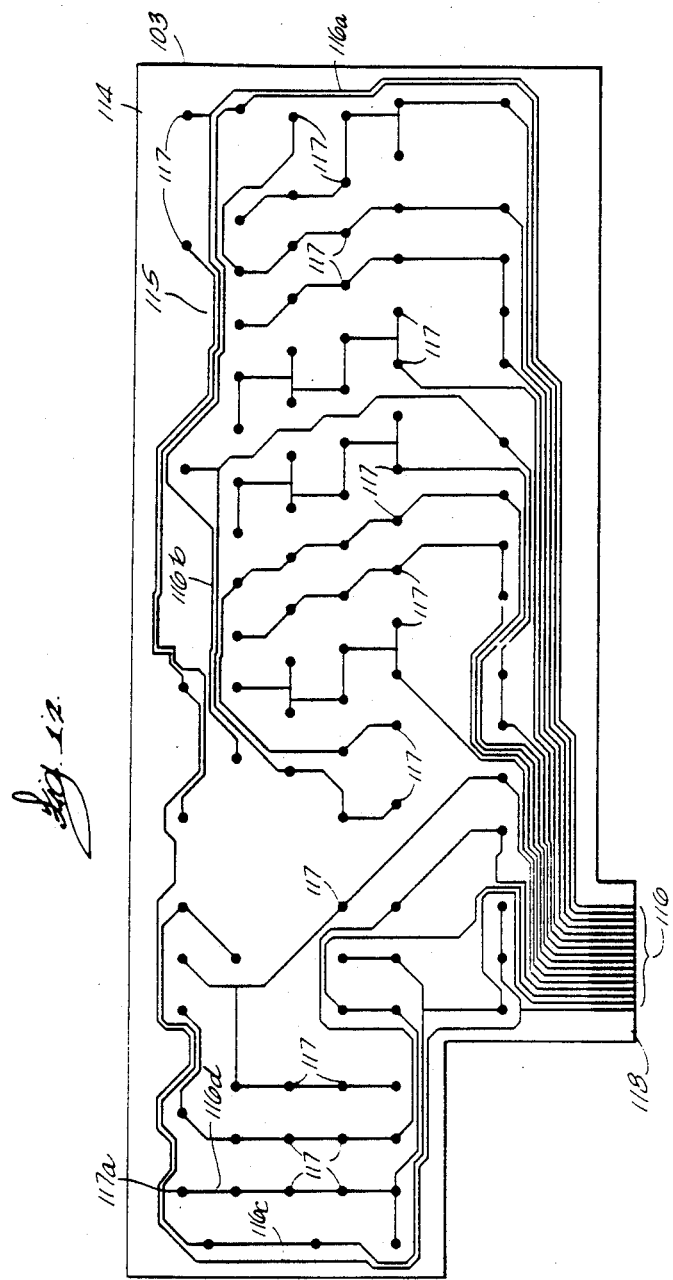

MEMBRANE SWITCHCORES WITH HIGH RESISITIVITY INK CIRCUITS

This invention relates to membrane switchcores of the type comprising appropriate conductive circuits carried on flexible plastic film membranes to be used with a keyboard for data entry apparatus such as a computer terminal or word processor.

A full-travel electronic keyboard is an essential user interface device required for the input of information for many types of data processing systems. The principal elements of a full-travel keyboard comprise keys or keypads supported for actuation by an operator, a switchcore defining an array of switches to develop electrical signals in response to actuation of the keys, and electronic circuitry associated with the switch array for detecting the actuation of an individual key. The associated circuitry typically includes drive means for scanning the switch array at a high rate and sense means for detecting the change in an electrical signal upon closure of a specific switch by manual actuation of the key. The switchcore is the device that generates the electrical signals ultimately decoded as commands transmitted to other elements of the system to have the product perform the functions the user intends. Thus, the switchcore is the internal communication link between the user and the microprocessor, memory and other electronic components of the data processing system.

The switch array for a state-of-the-art full-travel keyboard is now generally a membrane switchcore comprising a laminated structure o two thin flexible plastic films, each carrying selected circuitry applied thereto by printing or vacuum deposition techniques. Flexible plastic film membranes of this type have to a large extent replaced circuit boards of hard rigid plastic, such as phenolic or epoxied fiberglass on which the circuits are formed by metal plating and etching methods, as had been in common use prior to the development of flexible membrane elements. The switchcore may be either of the contact type or of the capacitance type and defines an array of crosspoints between circuits separated by an insulating layer, there being one crosspoint for each key cell.

A contact type of membrane switchcore has a set of contacts forming a switch connected across each crosspoint in the array, and is decoded with direct current (DC) drive and sense circuitry means connected to the switchcore and designed to ascertain the change in resistance when a key cell is actuated. A capacitance type of membrane switchcore includes a capacitor connected across each crosspoint in the array, and operates by presenting a change in the capacitance value at a crosspoint in response to actuation of the associated key. Capacitance switchcores can be of the moving plate type, in which the change in capacitance is achieved by physically moving a capacitor plate upon actuation of a key, or of the type including a fixed capacitor in series with a conventional contact switch across each crosspoint in the array. A capacitance switchcore is decoded by drive and sense circuitry means connected to the switchcore and designed to charge each key cell capacitor by an alternating (or pulse) current source, ascertain the net capacitance at a key cell, and determine whether the capacitance value is high or low relative to a reference value, so as to thereby sense key actuation. Thus, both contact and capacitance membrane switchcores effect a change in impedance between drive and sense connections when a key cell is actuated that is to be decodable by the circuitry connected to the switchcore so as to ascertain actuation of a specific key cell.

Membrane switchcores of both the contact type and the capacitance type include at least two conductive electrical circuits, with the circuits separated from one another by an insulating layer. Each circuit includes several conductive traces or leads which are arranged in a generally column form in one circuit and row form in the other circuit so as to define a matrix of crosspoints. Further, the traces include conductive key cell elements at each crosspoint so as to define individual key sites, the key cell elements comprising contact elements in the case of a contact switchcore or capacitor elements, with or without associated contact elements, in the case of a capacitance switchcore. My present invention relates to the material to be used to form the conductive circuits of a membrane switchcore.

The type of membrane switchcore to which the present invention relates is for use with an alphanumeric keyboard and is a physically large switch array, i.e. a matrix having a large number of crosspoints, with there being at least one crosspoint for each key of the keyboard. A switchcore of the invention is to be used with a full alphanumeric keyboard and therefore will have at least 36 crosspoints, 26 for the letter keys and 10 for the number keys. A full-travel keyboard for a typical word processor, such as modern machines incorporating a memory, will generally include at least 58 keys so that the membrane switchcore will have to have 58 crosspoints. Furthermore, it is not unusual for the keyboard of a computer terminal to have a matrix as large as 120 crosspoints to accommodate the numerous special function keys associated with a computer terminal. The nature of the data entry keyboard apparatus with which a membrane switchcore of the invention is to be used is such that a large size membrane matrix is required; one effect of this requirement is that at least some of the conductive traces of the conductive circuits that are carried on the plastic film membranes associated with the switchcore must traverse substantial distances across the films. Another requirement for a membrane switchcore of the type under consideration is that the data entry keyboard apparatus with which it is used requires fast decoding by the associated drive and sense circuitry. This results in the need to scan all the keys of the keyboard, i.e. all the crosspoints of the membrane switchcore matrix, at a high rate of speed, on the order of 10 milliseconds or less.

Large size membrane switchcores for use with a full alphanumeric keyboard as currently manufactured by all the companies whose products I am aware of are produced by using a relatively low resistivity material to define the conductive traces of the conductive circuits. This is believed to be a result of the requirements for a large matrix and the need for the matrix to be scanned at a rate of about 10 milliseconds or less. Also, because of the large matrix size, i.e. number of keys, and the need for each key site to be physically positioned according to the physical limitations of a human hand, the traces are relatively dense and overlapping. Low resistance traces and corresponding low input impedance decoding circuitry have therefore been used in large size membrane switchcores to mitigate crosstalk between traces and noise susceptibility. It should be noted also that the crosstalk and noise problems are exacerbated by the need for high speed scanning of the entire matrix in about 10 milliseconds or less. Particularly in prior capacitance switchcores, the values of the key cell capacitors were made large relative to stray capacitances to provide some degree of immunity to noise and cross-talk. With such large prior key cell capacitors, trace resistance had to be kept very low so that the time constant defined by the trace resistance and the key cell capacitance is small enough to allow the scanning to be completed in the approximate 10ms window. High resistance traces have previously been eschewed by those skilled in the art due to problems of crosstalk, noise and high speed scanning ordinarily associated with high resistance traces in a full alphanumeric switchcore, and also, perhaps more importantly, by the prior art view that low impedance inputs and low impedance loads are necessary for decoding a switchcore. Silver conductive ink is the most typical product employed for forming the conductive circuits of a large membrane switchcore and is used to minimize trace resistance. However, silver is a relatively expensive material and subject to corrosion and migration. Other materials and deposition techniques can be used, but they also can be relatively expensive and subject to corrosion and migration. In order to prevent corrosion, insulative passivation coatings are now used to cover the traces, particularly traces of silver conductive ink; also, inexpensive corrosion-resistant carbon inks are typically used to cover silver contact areas that must be electrically exposed. The carbon ink provides environmental protection for the silver ink, but because of its high resistivity, it is used only as a thin top cover, so that the effective resistance of the traces that carry the current, i.e. the silver traces, remains quite low. Thus, the prior art practice of making membrane switchcores with conductive circuits of low resistivity materials, particularly with respect to low resistance conductive traces of the circuits, requires relatively expensive materials and additional process steps in order to protect elements of silver and similar low resistance materials from the adverse effects of corrosion. In spite of this, it appears the current perception by the membrane switchcore industry is that the traces included in conductive circuits of a membrane switchcore must have low resistance, that costly materials are required to define traces, and that additional passivation overcoating of the traces is required. Furthermore, it is my belief that the perception of companies currently manufacturing membrane switchcores is that switchcores incorporating high resistance conductive circuitry cannot be reliably decoded due to the problems mentioned above. I have discovered, however, that membrane switchcores can be manufactured with circuits printed on flexible plastic film membranes with high resistivity materials and can be decoded successfully when fabricated according to the principles which I describe below.

My present invention provides a membrane switchcore for a data entry keyboard of the type including an electronic drive circuit for scanning the switchcore, and an electronic sense circuit for detecting an electrical signal generated by the switchcore upon actuation of a key characterized in that (1) the switchcore defines a matrix including at least 36 key cells, and (2) the switchcore includes at least two spaced conductive circuits each comprising conductive traces and conductive key cell elements connected thereto wherein the conductive traces and key cell elements defining paths for the transmission of electrical signals between drive and sense connections to the switchcore are formed of a conductive high resistivity ink having a resistivity of at least 10 ohms per square per 0.001" of ink thickness, and at least one such path has a path resistance greater than 10,000 ohms. In its more specific aspects, my invention provides a membrane switchcore thusly characterized that is decodable at a scanning rate of 10 milliseconds or less and/or the circuits are formed of a carbon-based ink.

These and other features, objectives and advantages of the invention will be made apparent in the description which follows that sets forth capacitance and contact membrane switchcores incorporating the concepts of the invention. The description is made by reference to the accompanying drawings, wherein:

FIG. 9 is a plan view, with portions broken away, illustrating a contact membrane switchcore of the invention;

FIG. 10 is a side view, with a portion broken away, of the switchcore of FIG. 9;

FIG. 11 is a plan view illustrating the first or upper circuit of the switchcore of FIG. 9;

FIG. 12 is a plan view illustrating the second or lower circuit of the switchcore of FIG. 9;

Figure 1:
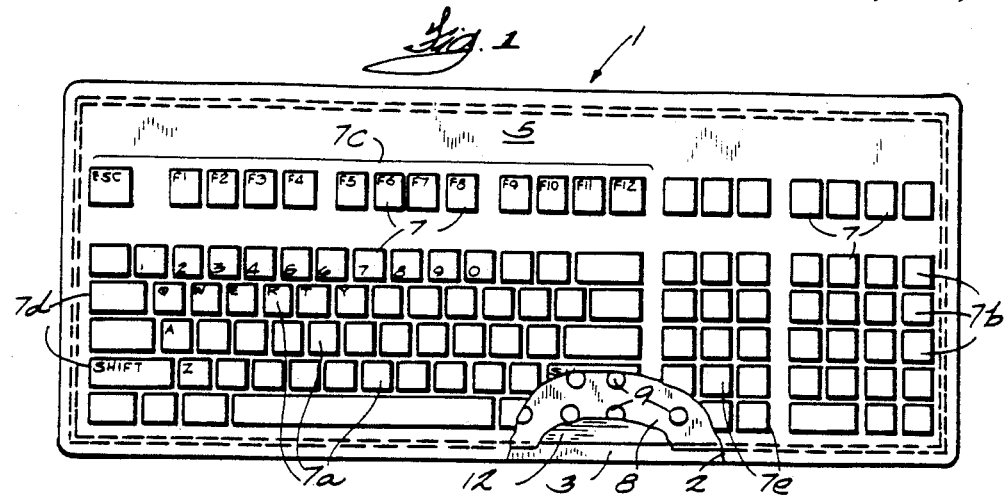
FIG. 1 is a plan view, with a portion broken away, of a full-travel keyboard incorporating a capacitance membrane switchcore of the invention.
Figure 2:
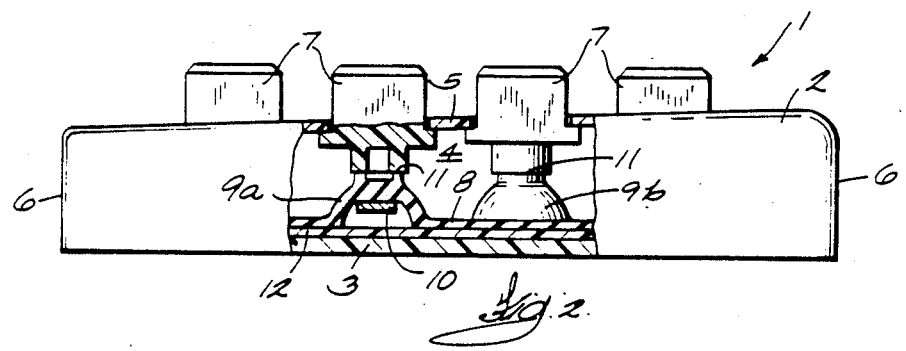
FIG. 2 is a side view of the keyboard of FIG. 1, with a portion broken away and with certain elements shown in cross section.

DESCRIPTION OF THE PREFERRED EMBODIMENTS (a) FIGS. 1 and 2.

FIGS. 1 and 2 illustrate an exemplary full-travel data entry keyboard 1, such as may be employed for a computer terminal, comprising a cover 2 attached to a base 3 to form an enclosed housing 4, the cover 2 including a top panel 5 and a side panel 6 extending from each of the four sides of the top panel.

Manually reciprocable keys 7 are supported along the top panel 5 of the housing. Keys 7a are arranged in a standard "qwerty" pattern and marked with the usual alphanumeric designations such as letters, numerals and punctuation marks for this type of keyboard. Keys 7b are located at the right hand side of the keyboard in a calculator array for mathematical functions. A horizontal row of keys 7c along the top of the keyboard are function keys, such as F1–F12 for example, and additional function keys are located at other positions on the keyboard such as keys 7d and 7e.

An elastomeric element 8 is positioned inside the housing of the keyboard immediately under the keys 7. Elastomeric element 8 is a sheet-like member that is formed to have a plurality of resilient domes 9; there is at least one dome 9 located under each key, with there being two domes 9 under some of the longer keys such as those identified as "shift" keys in FIG. 1. A conductive contact 10 is attached to the top of the interior surface of each dome 9 as illustrated in the sectional view of FIG. 2 with respect to dome 9a. The distal end 11 of a key 7 touches a dome 9 when the key is in its deactuated condition, as shown with dome 9b in FIG. 2. A resilient dome 9 is depressed or flattened to move a contact 10 downwards when an operator presses a key downwards, and the dome returns to its upright condition when the key is released so as to move a contact 10 upwards; the contacts 10 thereby comprise key actuated reciprocable contacts.

(b) Description of Illustrative Capacitance and Contact Membrane Switchcores, FIGS. 3–12.

This part (b) describes several membrane switchcores comprising both capacitance and contact switchcores as examples of the specific description of the invention presented in part (d). The switchcores described below are illustrative of the types of switchcores that can employ the present invention, but the invention also can be usefully practiced with other types of switchcores and the specific switchcores of FIG. 3–12 are to be considered as non-limiting examples of the invention.

Capacitance membrane switchcore 12 (see FIG. 3) is located immediately under the elastomeric element 8, on the inner surface of base 3 of the housing of the keyboard, and comprises a thin dielectric film layer 13 joined to a film substrate 14 by an adhesive layer 15 that is a thin layer of nonconductive adhesive. Film layer 13 and adhesive layer 15 define dielectric layer 18 of the switchcore. Switchcore 12 includes a conductive upper or first circuit 16 and a conductive lower or second circuit 17 spaced from one another by a dielectric layer 18. The first circuit 16 is formed along upper surface 18a of dielectric layer 18, and second circuit 17 is formed on upper surface 14a of substrate 14 that is adhesively bonded to the bottom surface 18b of the dielectric layer. The upper and lower circuits 16 and 17, respectively, define a matrix including a fixed capacitor at each key cell. Switchcore 12 is connected to suitable electronic circuitry including drive circuitry for supplying a drive signal to the matrix and sense circuitry for detecting a change in capacitance at a key cell when a particular key is actuated. The electronic circuitry, described later, comprises appropriate microcomputer, clock, decoder, comparator chips and the like which may be located along the upper section of the interior of the housing 4.

Figure 4:
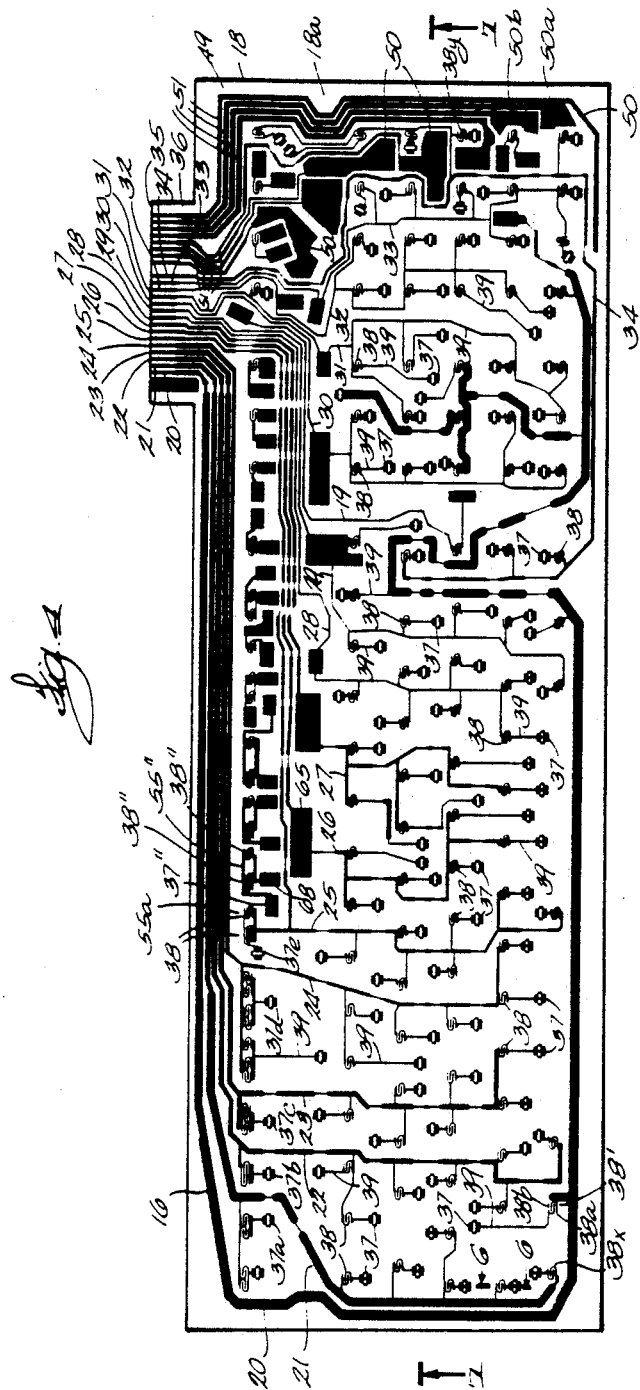
FIG. 4 is a plan view of the conductive circuits along the upper surface of the dielectric layer of the switchcore of FIG. 3.

FIG. 4 illustrates first circuit 16 of switchcore 12 that is defined along first or upper surface 18a of dielectric layer 18. First circuit 16 includes a plurality of conductive first traces 20–34, there being fifteen such first traces in the circuit. Each first trace extends along the surface 18a in a generally columnar arrangement and also extends to an edge 35 of the dielectric layer, which may be formed to define a tail 36 for connecting the switchcore to the external drive and sense circuitry. Each first trace 20–34 includes a plurality of first capacitor plates 37, each of which is electrically connected in series with a stationary contact 38; some plates 37 are connected to a contact 38 by a conductive lead 39 to properly position a plate 38 relative to the second circuit described in the next paragraph. Circuit 16 also has a first trace 19 that includes only one stationary contact 38 connected to a first capacitor plate 37. Each stationary contact 38 consists of a pair of spaced contact elements 38a and 38b, with element 38a connected to a trace 20–34 and element 38b connected to a first capacitor plate 37, as illustrated in connection with stationary contact 38'. Contact elements 38a and 38b are to be bridged by a reciprocable contact 10 when a key 7 is actuated. The stationary contacts 38 are positioned along a first trace such that there will be at least one stationary contact 38 located under each key 7 of the keyboard, and there is to be at least one first capacitor plate 37 for each key cell in the matrix.

Figure 5:
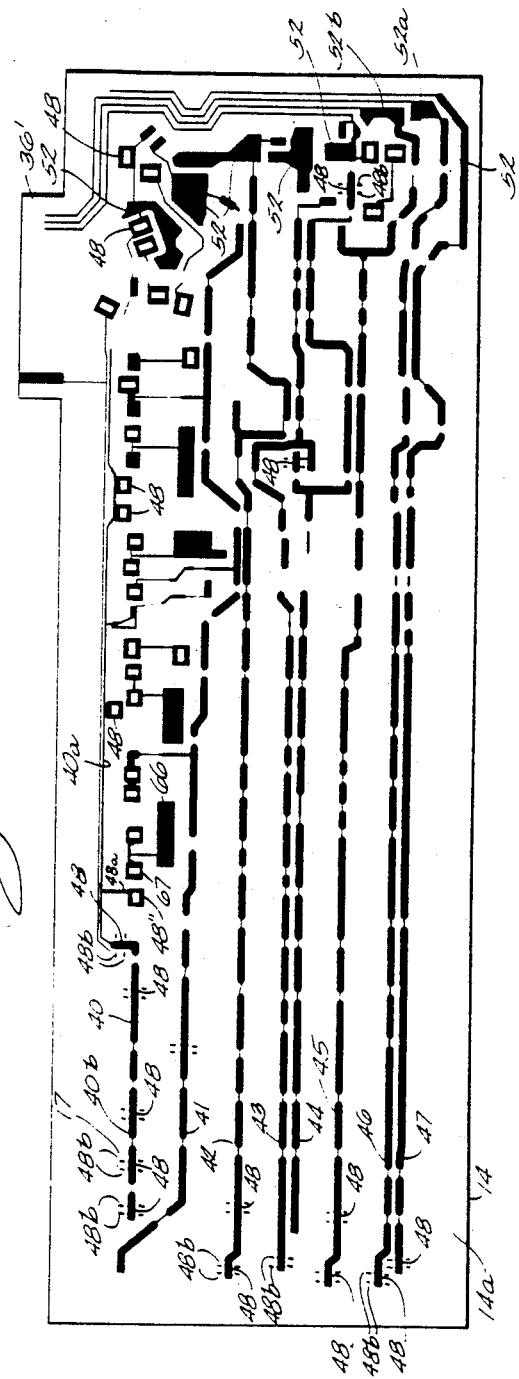
FIG. 5 is a plan view of the conductive circuit along the bottom surface of the dielectric layer of the switchcore of FIG. 3.

Second circuit 17, which is carried on upper surface 14a of substrate 14 and located along the bottom surface 18b of dielectric layer 18 so as to be spaced from the first circuit 16 by the thickness of the dielectric layer, is illustrated in FIG. 5. The second circuit comprises a plurality of conductive second traces 40–47, each of which extends in a generally row arrangement along the lower surface of the dielectric layer, and a plurality of second capacitor plates 48 electrically connected to each conductive second trace 40–47. Some of the second capacitor plates 48 are independent elements electrically connected to a second trace and other second capacitor plates 48 are defined by widened sections of a second trace located under a first capacitor plate 37; both of these constructions are illustrated in connection with second trace 40. A first group of second capacitor plates 48 are formed as hollow rectangular elements electrically connected to right-hand branch 40a of second trace 40, some by a conductive lead 48a. Another group of second capacitor plates 48 are defined by portions of a widened section of trace 40 that will be located underneath first capacitor plates 37a–37e of first circuit 16 (FIG. 4) as demarcated by pairs of spaced dashed lines 48b illustrated with left-hand branch 40b of second trace 40. It will be understood that second traces 41–47 also include second capacitor plates 48 defined by portions of a widened section of each trace, and at least one plate 48 is illustrated for each of these traces by pairs of spaced dashed lines 48b. The first circuit 16 and second circuit 17 are arranged along opposite surfaces of dielectric layer 18 with a first capacitor plate 37 electrically in registry with a second capacitor plate 48 such that there will a first capacitor plate and a second capacitor plate associated with each key cell so as to thereby define a unique capacitive key coupling between a first trace 20–34 and a second trace 40–47 for each key 7. Each first trace 20–34 is to have only one first capacitor plate 37 registered with a second capacitor plate 48 connected to a specific second trace 40–47 in order to achieve this capacitive key coupling unique to each key; the lead 39 described above in reference to FIG. 4 is used for this purpose to locate a plate 37 over a plate 48 of a second trace that is somewhat remote from a contact 38 associated with the plate 37.

As shown in FIG. 4, a conductive third circuit 49 is also formed along the first or upper surface 18a of dielectric layer 18 that includes a plurality, eight in the exemplary embodiment, of third capacitor plates 50 which are located along the right-hand side of the switchcore 12 as viewed in FIG. 4. Each third capacitor plate 50 is preferably of the same area, although the plates 50 can have different configurations or topographical boundaries and several shapes are depicted in FIG. 4. The specific size and shape of a third capacitor plate 50, as well as its position along the dielectric layer, will depend in large measure upon the space available in a specific capacitance membrane element. Third circuit 49 further includes a plurality of conductive third traces 51, there being one third trace 51 extending from each third capacitor plate 50 along the first surface 18a of the dielectric layer and along tail 36 to edge portion 35.

Referring now to FIG. 5, each second trace 40–47 of second circuit 17 is electrically connected to a fourth capacitor plate 52, there being eight fourth capacitor plates 52 in the second circuit 17 which also are located along the right-hand side of second circuit 17 as shown in the drawing. Second circuit 17 and third circuit 49 are to be electrically aligned with one another along opposite surfaces of dielectric layer 18 such that there will be a fourth capacitor plate 52 of second circuit 17 positioned under a third capacitor plate 50 of third circuit 49. Each fourth capacitor plate 52 is to have the same configuration as its respective third capacitor plate 50, as can be seen with reference to plates 50a and 52a, 50b and 52b, etc. A third capacitor plate 50 and its respective fourth capacitor plate 52 may each have the same area or one can be slightly larger than the other to ensure the plates are aligned when third circuit 49 and second circuit 17 are registered with one another along a dielectric layer.

It is convenient to die-cut dielectric film layer 13 and substrate 14 after they have been adhesively laminated together, in which event substrate 14 will have the same shape as dielectric layer 18 and thereby include a tail portion 36' which provides support for tail 36 of the dielectric layer.

Figure 3:
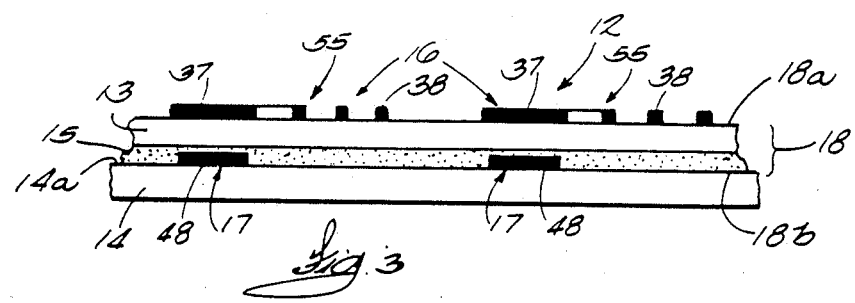
FIG. 3 is a partial sectional view of a portion of the capacitance membrane switchcore included in the keyboard of FIG. 1.

A suitable method to manufacture the switchcore 12 is described now with reference to FIG. 3. Second circuit 17 is screen printed on the substrate 14, and adhesive layer 15 is applied over the entire surface of substrate 14 so as to also cover the second circuit. Next, dielectric film layer 13 is laminated to adhesive layer 15, following which first circuit 16 and third circuit 49 are screen printed onto the exposed surface of film layer 13. Circuit 16 is registered with circuit 17 such that each first capacitor plate 37 of circuit 16 is located over a selected second capacitor plate 48 of circuit 17, whereby capacitor plates 37 and 48 together with a contact 38 define a key cell 55 as shown in FIG. 3. There are a plurality of key cells 55 in the switchcore 12. Some key cells 55 can have two contacts 38 so as to enable the end user a measure of latitude when locating some keys or to accommodate large special function keys, such as indicated by key cell 55a in FIG. 4. Also, second circuit 17 is registered with third circuit 49 such that a third capacitor plate 50 of third circuit 49 is located over a fourth capacitor plate 52 of second circuit 17 so as to define a fixed capacitor coupling each second trace 40–47 to a selected third trace 51.

Figure 6:
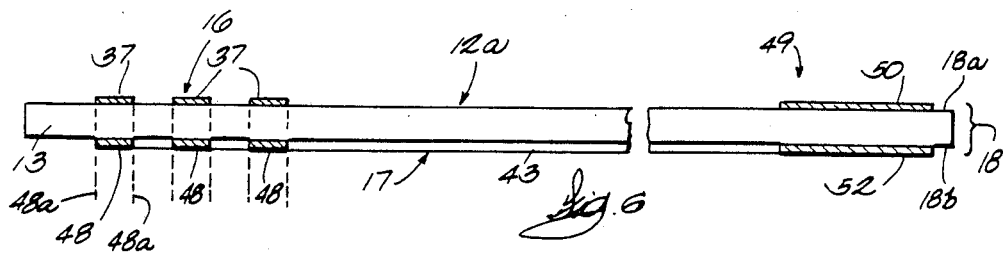
FIG. 6 is a horizontal sectional view, with portions broken away, illustrating a second capacitance membrane switchcore also incorporating the circuits of FIGS. 4 and 5.

A capacitance switchcore 12 can also be formed as a single layer construction which is illustrated in FIG. 6 and identified as switchcore 12a. The dielectric layer 18 consists of only the dielectric film layer 13. Second circuit 17, including second traces 40–47, second capacitor plates 48 and fourth capacitor plates 52, is screen printed along bottom surface 18b of the dielectric layer, which is the bottom surface of the film 13. First circuit 16 is screen printed along the upper surface 18a of the dielectric layer, which is the upper surface of film 13, including stationary contacts 38, first capacitor plates 37 and first traces 20–34. Third circuit 49, including its third capacitor plates 50 and third traces 51, is screen printed along upper surface 18a of the dielectric layer simultaneously with printing of first circuit 16. This construction provides a capacitance switchcore that can be manufactured in a minimum number of process steps, thus leading to a reduction in manufacturing costs.

In the exemplary switchcores 12 and 12a, the third and fourth capacitor plates 50 and 52, respectively, capacitively couple second circuit 17 along the lower surface of the dielectric layer 18 back to third circuit 49 along the upper surface of the dielectric layer. Each pair of third and fourth capacitor plates 50 and 52 defines an intertrace capacitive coupling between a second trace 40–47 of second circuit 17 and a third trace 51 of third circuit 49. Intertrace capacitive coupling is a separate invention that is not part of the present invention and is more fully described in my commonly-assigned U.S. patent application Application No. 07/262,906, filed on Oct. 25, 1988, now U.S. Pat. No. 4,736,076, titled Capacitance Membrane Switchcore With Intertrace Capacitive Coupling and/or Intratrace Capacitive Coupling, the disclosure of which is incorporated herein by reference for a more complete description of this feature. Intertrace capacitive coupling is a useful feature of a switchcore as it allows all connections to external circuitry to be made along one layer of the switchcore, i.e. to the first traces and third traces of circuits 16 and 49, respectively, on surface 18a of the dielectric layer; however, it should be pointed out that a membrane switchcore of this invention need not include intertrace capacitive coupling.

Exemplary switchcore 12 also is illustrated as including intratrace capacitive coupling, another feature of the invention of the aforesaid commonly-assigned U.S. Pat. No. 4,736,076, Capacitance Membrane Switchcore with Intratrace and/or Intratrace Capacitive Coupling. Intratrace capacitive coupling enables a trace to have a branch along upper surface 18a of the dielectric layer, another branch along lower surface 18b of the dielectric layer, and a third branch along upper surface 18a of the dielectric layer, wherein the respective branches are capacitively coupled. For example, first trace 26 includes first upper intratrace coupling capacitor plate 65 (FIG. 4) in registry with first lower intratrace coupling capacitor plate 66 along lower surface 18b (FIG. 5) electrically connected to second lower intratrace coupling capacitor plate 67 that is in registry with second upper intratrace coupling capacitor plate 68 along upper surface 18a of the dielectric layer (FIG. 4) to feed signal to key cell 55" that is defined by a pair of contacts 38"; contacts 38" in turn, are electrically connected to upper capacitor plate 37" associated therewith which overlies second capacitor plate 48" of the second circuit 17 (FIG. 5) that is electrically connected to second trace 40. First traces 27, 28, 29, 30, 31, 32, 33 and 19 are also shown as including the intratrace capacitive coupling feature of the aforesaid Pat. No. 4,736,076. Intratrace capacitive coupling is a useful feature as it increases a switchcore designer's options by enabling routing portions of traces under other traces when the nature of the switchcore imposes layout restrictions;

however, it should be pointed out that a membrane switchcore of this invention need not include intratrace capacitive coupling.

Figure 7:
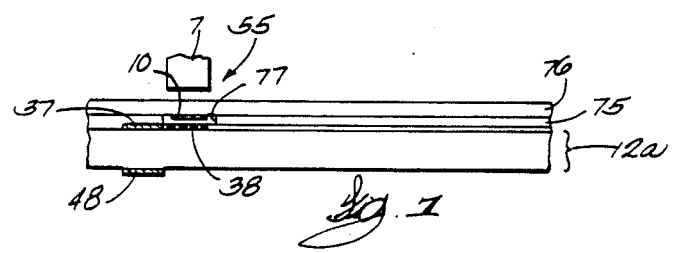
FIG. 7 is a partial sectional view similar to FIG. 3 illustrating an alternate construction for the switchcore of FIGS. 3 and 6.

Switchcores 12 and 12a as described can be characterized as the "open" type of capacitance switchcore wherein the upper circuit is exposed to the environment. Both constructions also can be made as a "closed" type of capacitance membrane element, which is illustrated in FIG. 7 that shows switchcore 12a embodied in a closed construction. A spacer layer 75 is positioned between the upper surface of switchcore 12a and a flexible film top layer 76. The spacer layer 75 may comprise a thin sheet of plastic film that is die cut with apertures 77 positioned over each stationary contact 38 of the first circuit 16, there being an aperture 77 at each key cell of the array. When spacer layer 75 is made from plastic film, it will be laminated with nonconductive adhesive to both the upper surface of switchcore 12a and the bottom surface of top layer 76. Also, however, spacer layer 75 may be a layer of nonconductive adhesive screen printed in a pattern that defines the apertures 77. Movable contacts 10 are applied along the bottom surface of top layer 76, i.e. the surface thereof facing the capacitance switchcore 12a, and arranged such that there is a contact 10 located within each aperture 77 of the spacer layer. When a key 7, depicted schematically in FIG. 7, is actuated, it is pressed downward so as to contact top layer 76 and deflect the layer sufficiently to bring contact 10 into electrical contact with stationary contact 38. The closed construction is useful in instances in which maximum environmental protection of the capacitance switchcore is required, or when a flexible film top layer 76 is desired for a particular keyboard. The top layer 76 can be printed with graphics defining individual key pads for uses of the switchcore that do not employ reciprocable keys 7 supported in a housing, or the top layer 76 can be formed to include a dome at each key cell. These latter types of constructions also obviate the need for an elastomeric element such as domed element 8 illustrated in FIGS. 1 and 2.

Figure 8:
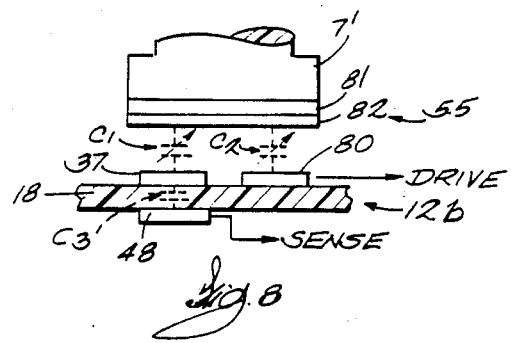
FIG. 8 is a sectional view similar to FIG. 3 illustrating a third form of capacitance membrane switchcore.

Capacitance membrane switchcores 12 and 12a each are illustrated as including a contact 38 and a fixed capacitor consisting of a first capacitor plate 37 and a second capacitor plate 48 as the elements at each key cell of the switchcore. The present invention also can be incorporated in a capacitance membrane switchcore having only capacitor plates as the key cell elements, which type is illustrated as switchcore 12b in FIG. 8 wherein each key cell 55 includes a driven capacitor plate 80 and a first capacitor plate 37 along the upper surface of dielectric layer 18 and a second capacitor plate 48 along the bottom surface of the dielectric layer. First capacitor plate 37 is independent of and not electrically connected to driven plate 80. A key 7' is included with a keyboard incorporating a capacitance membrane switchcore having key cell elements as shown in FIG. 8 and includes a conductive movable capacitor plate 81 at its distal end that is covered with a dielectric layer 82, which may be a coating or thin plastic film. Plate 81 at the end of key 7' and the dielectric layer 82 define a variable capacitor C1 with first capacitor plate 37 and a variable capacitor C2 with driven plate 80. When key 7' is actuated, it is pushed downward so that dielectric layer 82 contacts plates 37 and 80 to change variable capacitors C1 and C2 from low to high capacitance and thereby generate a detectable signal across fixed capacitor C3 which is defined by first and second plates 37 and 48 along the upper and lower surfaces, respectively, of dielectric layer 18. In a capacitance membrane switchcore incorporating key cell elements of the type shown in FIG. 8, driven plates 80 are connected to the drive circuitry of the external electronic components and second capacitor plates 48 are connected to the sense circuitry thereof. It should be apparent to those skilled in the art that the intertrace trace coupling and intratrace coupling concepts described above could equally be applied to the embodiments of FIGS. 7 and 8 in order to provide both drive and sense lines on a common surface of the dielectric layer.

Contact membrane switchcores also can be produced in accordance with the concepts of the present invention, and an exemplary contact switchcore is illustrated in FIGS. 9–12.

Referring first to FIG. 9, contact membrane switchcore 100, illustrated with its several layers partially broken away for clarity of description, comprises a top film 101, a spacer layer 102 and a bottom film 103; films 101 and 103 are flexible plastic films, and spacer layer 102 may be a flexible plastic film or a layer of nonconductive adhesive applied in the requisite pattern. When spacer layer 102 is a flexible plastic film, it is laminated with nonconductive adhesive to the bottom surface of top layer 102 and the top surface of bottom film 103. The bottom surface 104 of top film 101, see also FIG. 10, carries first circuit 105 of the switchcore. A portion of first circuit 105 is shown in dashed lines in FIG. 9 to indicate that it is along the bottom surface of top film 101 and comprises a plurality of conductive first traces 106 and a plurality of conductive first contacts 107 electrically connected to each first trace 106. First traces 106 extend across the bottom surface 104 of top film 102 to the end of tail 108 formed as an integral portion of film 101 for connection to external electronic circuitry.

The complete first or upper circuit 105 is illustrated in FIG. 11. First circuit 105 includes eight conductive first traces 106; a plurality of conductive first contacts 107 are electrically connected to each first trace. The first contacts 107 are arranged in row form along bottom surface 104 of the top film 101. Several first traces 106 are very long, see e.g. traces 106a, 106b and 106c.

The upper surface 114 of bottom film 103 of switchcore 100, see also FIG. 10, i.e. the surface 114 that faces the bottom surface 104 of film 101, carries second or lower circuit 115 of the switchcore 100. Second circuit 115 comprises a plurality of conductive second traces 116 and a plurality of conductive second contacts 117 electrically connected to each second trace 116. Each second trace 116 extends along surface 114 of film 103 to the end of tail 118 formed as an integral portion of bottom film 103.

FIG. 12 illustrates the complete second circuit 115 that is defined along upper surface 114 of bottom film 103. Second circuit 115 includes 16 conductive second traces 116; a plurality of conductive second contacts 117 are electrically connected to each second trace 116. Second contacts 117 are arranged in generally columnar form along surface 114 of bottom film 103. It will be noted that several second traces 116 are very long, see for example second traces 116a–116c.

Spacer layer 102 includes a plurality of apertures 120. As illustrated in FIGS. 9 and 10, an aperture 120 of the spacer layer surrounds each pair of key cell elements comprising a second contact 117 of the second circuit 115 and a first contact 107 of first circuit 105. Apertures 120 are connected to vent passages 121 also defined in the spacer layer which lead to an edge of the switchcore to prevent build-up of excessive air pressure between films 101 and 103. As indicated in FIG. 10, each first contact 107 and second contact 117 within an aperture 120 define a key cell 122 of the switchcore matrix. The key cell elements in a contact type of membrane switchcore consist of a pair of conductive contacts. Contacts 107 and 117 within an aperture are kept electrically out of contact with one another by the spacer layer 102. A key 7, illustrated schematically in FIG. 10, is located at each key cell 122; when key 7 is actuated, top film 101 is pressed downwardly towards bottom film 103 so as to bring a first contact 107 into electrical contact with a second contact 117. Thus, the top film 101 generally is thinner than bottom film 103 so as to more readily flex upon actuation of a key. An elastomeric element such as domed element 8 illustrated in FIGS. 1–3 may or may not be employed with switchcore 100. Also, top film 101 of switchcore 100 can be thermoformed so as to include domes 123 as illustrated in dashed line in FIG. 10, in which event first contacts 107 are formed along the inner surface of a dome. The dome can be flexed downwardly by finger pressure to actuate a key cell; this construction eliminates the need to use reciprocable keys in a keyboard employing a domed top film membrane switchcore.

Membrane switchcores 12, 12a, 12b and 100 described above each include at least two circuits arranged along opposite surfaces of a insulating layer so as to be spaced apart by the insulating layer which serves to electrically insulate the circuits from one another. In capacitance switchcores 12, 12a and 12b, the dielectric layer 18 functions as the insulating layer in addition to forming the dielectric layer for the various capacitors of the switchcores. In contact switchcore 100, spacer layer 102 functions as the insulating layer of the construction. It should be noted that the insulating layer can be made of plastic film, adhesive or a combination of plastic film and adhesive as illustrated in the switchcores, or it also can be made as a coating of a suitable insulating material for which various compositions are known in the art.

The membrane switchcores of this invention are intended for use in an alphanumeric keyboard and are adapted to be connected to electronic drive circuitry for transmitting an electrical signal to the switchcore and electronic sense circuitry for detecting a change in the electrical signal transmitted across the switchcore when a key is actuated. The electronic drive and sense circuitry include an appropriate microcomputer and associated components that are generally carried on a circuit board located internally of a keyboard and connected to the tail or other appropriate position of a switchcore. The drive circuitry is connected to either the row or column traces of a switchcore and the sense circuitry is connected to the other of the row or column traces of the switchcore. Thus, for example, the drive circuitry can be connected to first traces 20–34 of switchcores 12, 12a and 12b and the sense circuitry connected to third traces 51, the connections to these traces being made at the tail 36; conversely, drive circuitry can be connected to third traces 51 of the switchcores and sense circuitry connected to first traces 20–34. Similarly, with contact switchcore 100, drive circuitry can be connected to traces 106 and sense circuitry connected to second traces 116, the connections being made along tails 108 and 118 respectively, or drive circuitry can be connected to second traces 116 and sense circuitry connected to first traces 106. Row traces, key cell elements and column traces thus define paths for the transmission of electrical signals between drive and sense connections to the switchcore.

The switchcores of the invention include key cell elements, comprising capacitors and/or contacts, that effect a change in impedance between drive and sense connections to the row and column traces of the switchcore when a key cell is actuated. The change in impedance is detected by the associated electronic sense or decoding circuitry as a net change in capacitance with capacitance membrane switchcores, such as switchcores, 12, 12a and 12b described above, or as a change in resistance with contact membrane switchcores, such as switchcore 100 described above.

(c) Materials of Construction

The membrane switchcores 12, 12a, 12b and 100 described above are to be made with flexible plastic films for various strata of the constructions. Substrate 14 of switchcore 12, top film layer 76 of switchcore 12a, films 101 and 103 of switchcore 100, and films when used for spacer layer 75 or 102 can be made of any of the nonconductive flexible plastic films suitable for flexible membrane switches. Polyester films, such as polyethelene terephthalate films, are the most commonly used materials, but polycarbonate films, polyimide films, polysulfone films, polyolefin films and unplasticized polyvinyl chloride films also may be used. Films such as layers 14, 75, 76 and 101–103 can be in the range of 1 to 15 mils thick (0.025 to 0.4 mm thick), or thicker if so desired, with films about 5 mils thick (0.13 mm thick) being preferred as providing physical properties appropriate to most flexible membrane switchcore applications at a reasonable cost. The dielectric film layer 13 also is to comprise a layer of nonconductive flexible plastic film, such as polyester film (usually polyethylene terephthlate film), polycarbonate film, polyvinyl fluoride film, polyvinylidene fluoride film, or a polyolefin film. Suitable materials are available commercially from a number of companies, including Dupont and General Electric. Because the film layer 13 is to form all or part of the dielectric layer of a capacitance switchcore, it is most useful that the layer be quite thin so as to provide for high capacitance values; for this reason, capacitor grade plastic films of about 0.1 mil to 5 mils thick (0.002 to 0.13 mm thick) are generally most useful, with a film about 0.25 to 1.0 mils thick (0.006 to 0.25 mm thick) preferred for most applications.

A structural adhesive such as when used for adhesive layer 15 employed to laminate dielectric film 13 to substrate 14 or when used as a spacer layer 102 may comprise a layer of nonconductive heat activated adhesive, thermoset adhesive, or pressure sensitive adhesive. Many suitable adhesives are well known in the art and a specific adhesive should be selected with regard to the particular materials employed for the film layers so as to obtain the bonding strength and dielectric characteristic required. The adhesive layer may be of any selected thickness, with a thickness in the range of 0.1 to 5 mils (0.002 to 0.13 mm) being suitable for most switchcores, although the layer can be thicker if so desired.

(d) Specific Description of the Invention

A first characteristic of a switchcore according to the present invention is that it is to be a large size membrane switchcore, by which is meant that a membrane switchcore of the invention is to have first and second conductive circuits that define at least 36 key cells. This provides a full alphanumeric keyboard including 26 letter keys and 10 number keys, so as to be suitable for use, for example, with a typewriter; most membrane switchcores to be used for a typewriter will include 50 to 60 key cells, comprising various function keys, such as a space bar, in addition to the alphanumeric keys. The exemplary capacitance membrane switchcores 12 and 12a described in part (b) when incorporating the first and second circuits of FIGS. 4 and 5 have an 8×15 matrix comprising 8 second traces 40–47 and 15 first traces 20–34 that defines 120 key cells, and trace 19 adds another key cell for a total of 121 key cells in the matrix. Contact membrane switchcore 100 of FIGS. 9–12, is suitable for use for an IBM ® clone keyboard for a computer, and is shown as comprising an 8×16 matrix (8 first traces and 16 second traces) that defines 101 key cells. Switchcores 12 and 100 are illustrated at a reduced scale in FIGS. 4, 5 and 9–12; the actual size of a switchcore 12 is about 18 inches long by 6 inches wide and the actual size of a switchcore 100 is about 17 inches long by 6.5 inches wide. It can be seen that a membrane switchcore including circuits defining at least 36 key cells suitable for combination with a data entry keyboard used for a typewriter, computer, and related electronic apparatus, will be large in area, thus resulting in one or more traces of the circuits of the switchcore that are quite long in order to reach a key cell at a selected location.

A second characteristic of a membrane switchcore of the invention is that it is to be combined with a data entry keyboard of the type including an electronic drive circuit for scanning the switchcore and an electronic sense circuit for detecting an electrical signal generated by the switchcore upon actuation of a key wherein the electronic drive circuit further includes timer means for controlling round-robin scanning, or addressing, of all the key cells of the switchcore at a rate of 10 milliseconds or less. The prior art solution to the problem of providing a large size membrane swichcore including at least 36 key cells that is decodable at a scanning rate of 10 milliseconds or less has been to print the circuits of the switchcore with an ink having very low resistance. For example, prior art alphanumeric membrane switchcores scannable at 10 milliseconds or less use silver ink to form the conductive traces and key cell elements of the switchore which has a resistivity of about 0.01 ohms per square per 0.001" of thickness. Carbon ink is sometimes employed in such prior art switchcores to cover silver ink key cell elements or traces that are exposed to provide a passivation coating that will prevent corrosion and reduce migration of the silver ink; in this type of prior art membrane switchcore, however, the silver ink traces and silver ink key cell elements are the primary current carrying elements of the circuits of this type of prior art switchcore.

My present invention departs radically from the prior art by providing large size membrane switchcores having circuits printed with conductive inks having a resistivity of at least about 10 ohms per square per 0.001" of ink thickness. Further, the use of high resistivity inks in a large size membrane switchcore will generally result in the switchcore having at least one trace loop or path that has a resistance of at least about 10,000 ohms. For instance, capacitance switchcore 12 when made with circuits printed with a high resistivity ink in accordance with this invention, a carbon ink having a measured resistivity of 30 ohms per square per 0.001" ink thickness (Acheson Electrodag ® 423SS) in this specific example, includes two trace loops that have a resistance of about 60,000 ohms when a key is actuated, one of which is defined by contact 38x connected to first trace 21 and the other is defined by contact 38y connected to first trace 34 (see FIG. 4) and their respective second traces 47 and 44 upon key actuation. Similarly, contact switchcore 100 includes a trace loop or path that has a resistance of about 150,000 ohms defined by first contact 107a connected to first trace 106a and second contact 117a connected to second trace 116d when the circuits of the switchcore are printed with the above high resistivity carbon ink in accordance with this invention. High resistivity conductive inks suitable for the practice of this invention will include finely divided graphite or carbon particles dispersed in a suitable binder such as a vinyl resin or acrylic resin, and are available commercially. In its most useful form, considering cost, corrosion resistance and absence of migration problems, the high resistivity ink is to consist only of graphite or carbon particles in a suitable binder. Also, however, the high resistivity ink can include a mixture of graphite or carbon particles and other more conductive (less resistive) particles dispersed in a suitable binder wherein the conductive portion of the mixture contains more than 50% by weight of carbon particles and has a resistivity of at least about 10 ohms per square per 0.001" of ink thickness. The term "carbon-based ink" as used herein and in the claims is defined to mean an ink containing 100% carbon particles as the sole conductive material and also at least 50% by weight or more carbon particles as one component of a mixture of two or more conductive materials. The high resistivity inks are to have a viscosity suitable for printing onto plastic film membranes, preferably by screen printing techniques.

The prior art has not used high resistivity inks for printing conductive circuits on large membrane switchcores, primarily due to the deleterious effects of the much higher trace resistances which result therefrom. Specifically, the net resistance around a complete drivesense path in a full alphanumeric keyboard printed with silver ink is usually under 1K ohms (K=1,000). The same path printed with a high resistivity ink, such as carbon ink, may have a resistance of 10K ohms or more, in some cases as much as 300K ohms and this apparently has been thought by the prior art to preclude the manufacture of viable large membrane switchcores having circuits applied with high resistivity inks that can be decoded without the use of high cost electronic components. Consequently, there is no teaching of the problems involved in using high resistance circuits in large membrane switchcores nor the disciplines, including circuit design and decoding circuit parameters, needed to enable practical, cost-effective utilization of large membrane switchcores having circuits applied with high resistivity inks.

The utilization of switchcores with such high resistance circuits is a principal subject of this invention as taught below in relation to the previously described capacitance switchcore and contact switchcore. As will be seen, the effect of very high circuit resistances poses somewhat different problems with capacitance and contact switchcores because of the differing applications and type of decoding applied, but it is shown that both capacitance and contact switchcores can nevertheless be realized according to this invention in such a manner as to provide for effective, reliable decoding.

Figure 13:
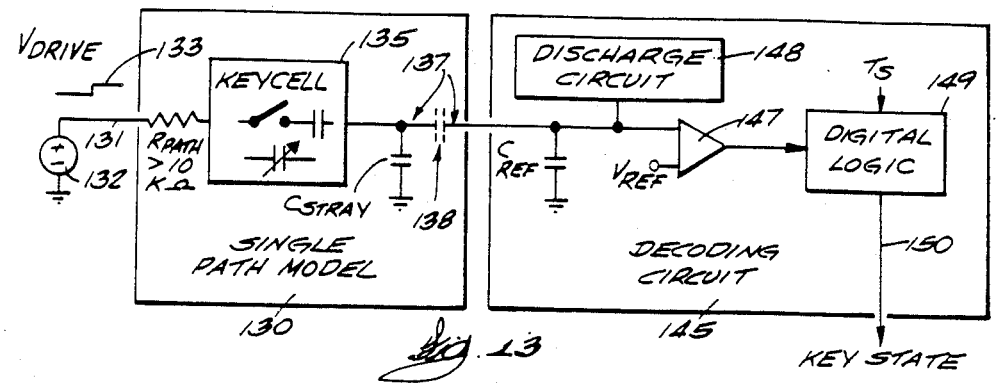
FIG. 13 is a block diagram of a capacitance switchcore of the invention.

Referring to FIG. 13, a single path through a capacitance type membrane switchcore such as switchcore 12 is represented by a model 130. A drive line 131 connects the model path 130 to a voltage source 132. Drive line 131 represents a row or column trace of a capacitance switchcore, such as for example a first trace 20-34 of switchcores 12, 12a and 12b. The voltage source 132 produces a voltage $V_{DRIVE}$ which includes a step, or pulse, 133 at a time $T_D$. It should be understood that the entire capacitance membrane switchcore includes a plurality of drive lines 131 each connected to its own drive voltage source, only one of which is activated at a time, e.g. the time at which the step 133 occurs. The remainder of the drive lines are maintained at a low voltage, e.g. grounded. The pulse 133 occurs when the particular drive line 131 is selected, and terminates when the drive line 131 is deenergized in order to select another drive line. The response of the model 130 is referenced to the activation time $T_D$ of drive line 131 in the description below.

In the model 130, the drive line 131 connects to a resistor $R_{PATH}$ in series with a key cell 135. As shown in FIG. 13, the key cell 135 may comprise any type of capacitance key cell structure, including fixed capacitor and contact switch key cells and variable capacitance key cells as depicted. Resistor $R_{PATH}$ represents the total path resistance, including the resistance of the traces both before and after the key cell 135. Because of the trace length and width restrictions imposed in a full alphanumeric keyboard, the total path resistance $R_{PATH}$ usually exceeds 10K ohms when the traces are printed with high resistivity inks such as carbon inks.

A sense line 137 is modeled as the conductors leading from the key cell 135 and $R_{PATH}$ series combination to a decoding circuit 145. Sense line 137 represents a row or column trace of a capacitance switchcore, such as for example a second trace 40-47 of switchcores 12, 12a and 12b, when drive connections are made to first traces 20-34 thereof, together with a third trace 51 coupled to a second trace when intertrace capacitive coupling is included in the switchcore. A stray capacitance $C_{STRAY}$ shunts the sense line 137. The cause and effect of such stray capacitance is inherent in capacitance membrane switchcores, and is described in detail below. As described in part (b) above, the sense line 137 may include an intertrace coupling capacitor, represented at 138, in series with the sense line 137. Because of the large size of the intertrace coupling capacitor 138, it has negligible effect on the path model 130 or the decoding thereof, and is therefore shown in dotted line.

The sense line 137 connects to a decoding circuit 145, which comprises a reference capacitor $C_{REF}$, an analog comparator 147, a discharging circuit 148 and a digital logic circuit 149. $C_{REF}$ is generally sized to have a value equal to the sum of the key cell capacitors in the sense line of a switchcore that has the highest number of key cells. Between sampling periods, the discharging circuit 148 bleeds off any residual charge on the reference capacitor $C_{REF}$, restoring it to a known state of charge before application of the drive pulse 133. The discharging circuit 148 may be a simple bleed resistance or an active element switchable between a high impedance and low impedance state as is known in the art. When the drive pulse 133 occurs at time $T_D$, current through the key cell capacitance produces a charge which is divided between the stray capacitance $C_{STRAY}$ and the reference capacitor $C_{REF}$. The time needed to complete the charge transfer is determined by the time constant formed by the path resistance $R_{PATH}$ and the net capacitance of the key cell, stray and reference capacitances.

(Control of the time constant is important to the practice of this invention as discussed in detail below). The voltage on sense line 137 is therefore proportional to the charge delivered to $C_{REF}$ through the key cell capacitance, and is connected to one input of the analog comparator 147. The other input of analog comparator 147 is connected to a reference voltage $V_{REF}$. A sampling time signal $T_S$ is input into the digital logic circuit 149, and is activated at a fixed time period after $T_D$ by a control circuit (not shown). The delay between $T_D$ and $T_S$ is long enough to allow the delivery of charge to the reference capacitor $C_{REF}$, but short enough to avoid excessive drift, or error, in the reference capacitor voltage. The output of analog comparator 147 is sampled at time $T_S$ by the digital logic circuit 149. If the key cell 135 is open, e.g. low capacitance, then a minimum amount of charge is delivered to reference capacitor $C_{REF}$ resulting in a voltage less than the reference voltage $V_{REF}$ when sampled at time $T_S$. In that case, the digital logic circuit 149 outputs an "open" indication on a KEY STATE output line 150. Conversely, if the key cell 135 is closed, e.g. high capacitance, then a relatively greater amount of charge is delivered to reference capacitor $C_{REF}$, resulting in a voltage greater than the reference voltage $V_{REF}$ at time $T_S$, and the digital logic circuit 149 outputs a "closed" indication on KEY STATE output line 150. Typical values for the reference voltage $V_{REF}$ and the sampling time $T_S$ are 100 millivolts (mV) and 21 microseconds (uS), respectively. Although other types of capacitance switchcore decoding circuits are known, all such decoding circuits operate on essentially the same principle, i.e. measuring the charge delivered by the key cell capacitor.

One motivation for using capacitance switchcores is to achieve multiple key rollover performance, e.g. the capability to detect multiple key closures. When multiple keys are simultaneously depressed, "phantom" paths can be created to give the appearance of a key depression when that key is not actually depressed. In a two dimensional matrix, at least 3 key closures are required to produce a phantom. In a contact switchcore, it is not possible to distinguish between a phantom path and a true closure because the contact switches when closed are very low impedance; a phantom path and a true path have essentially the same impedance. However, in a capacitance switchcore, each key cell includes a series capacitor which functions as a non-zero impedance element. A phantom path in a capacitance switchcore therefore includes three key cell capacitors in series, whereas a true path is a single key cell capacitor; the differences between the two can be discriminated by a decoding circuit. Therefore, a capacitance keyboard is preferred in applications where multiple key rollover is desired.

Preferably, a capacitance type switchcore and its associated decoding circuit should be able to discriminate between any combination of key closures, referred to as N-key rollover, or at least some degree of multiple key rollover. Stray capacitances occur throughout the switchcore, but the majority of stray capacitance occurs due to multiple key closures. The switchcore is decoded as a matrix, usually with eight key cells attached to each sense line. The non-selected key cells on a common sense line are parasitic, and act to reduce the signal available from the key cell being sensed. As a result of the need to provide multiple key rollover, the switchcore and decoding circuit must tolerate the additional stray capacitance caused by multiple key closures.

The stray capacitance $C_{STRAY}$ in the path model 130 represents primarily the capacitance of other key cells connected on the same sense line. For the purpose of decoding analysis, the value of $C_{STRAY}$ can be considered to take on two different values in order to effect the worst case for the analysis being performed. For example, when the key cell 135 is open, or low capacitance, the key cell capacitor must not deliver sufficient charge to the reference capacitor $C_{REF}$ to cause a "closed" reading even if all the other key cells on the same sense line are open, e.g. $C_{STRAY}$ is at a minimum capacitance. Conversely, when the key cell 135 is closed, the key cell capacitor must deliver enough charge to the reference capacitor $C_{REF}$ to cause a "closed" reading even if all the other key cells on the same sense line are closed, e.g. $C_{STRAY}$ is at a maximum value. As a result, an important factor in a capacitance switchcore is the ratio of the open key cell capacitance to the closed key cell capacitance. A ratio of 8:1 is preferred, although smaller ratios down to 5:1 or smaller may be decoded with increasing difficulty.

The problems associated with using high resistivity inks in a capacitance membrane switchcore can now be appreciated. A very high path resistance $R_{PATH}$ greatly complicates the decoding of a closed key cell. Recall that the worst case for a closed key cell occurs at a maximum value of stray capacitance $C_{STRAY}$. That means that with the path resistance $R_{PATH}$ also large, a very long time constant is formed by the path resistance $R_{PATH}$ and the parallel combination of the stray capacitance $C_{STRAY}$ and the reference capacitance $C_{REF}$. An important aspect of the utilization of this invention is appropriate management of the time constant with circuits printed with high resistivity inks by means of circuit design techniques. According to the techniques described below, the path resistance $R_{PATH}$ can be reduced, particularly in the worst case paths, to useful, but high, levels, even though the traces are printed with high resistivity inks, and this can be accomplished without excessive increases in stray capacitance and without the use of substantial amounts of high cost ink compounds. Stray capacitance in a capacitance switchcore is critical; thus, reducing path resistance by simply increasing trace width can increase stray capacitance in areas of overlap between traces, thereby negating any gains resulting from reducing the path resistance by circuit design. Reducing path resistance by printing circuits with substantial amounts of expensive, high conductivity inks, such as all silver or high silver content inks, is contrary to this invention, which seeks to eliminate or substantially reduce the use of such expensive inks. Rather, this invention teaches techniques for reducing path resistance consistent with the use of high resistivity carbon based inks, and therefore even with the techniques described in this invention, the nominal path resistance for switchcores printed with high resistivity inks remains quite high, again approximately 10K ohms or more, and the $R_{PATH}$-$C_{STRAY}$ time constant can still be too long for effective decoding. (The time constant developed by $R_{PATH}$ and $C_{STRAY}$ combination is referred to as the "RC time constant" in the description which follows). This invention therefore further teaches the reduction of the key cell closed capacitance. As previously stated, the ratio of open to closed key cell capacitance is paramount in a capacitance switchcore; therefore, if the key cell closed capacitance is to be decreased, proportional reductions in the key cell open capacitance must also be made. A detailed analysis of these concepts is given below. In summary, the utilization of high resistivity inks such as carbon-based inks in a capacitance membrane switchcore according to this invention involve an understanding of (1) controlling or managing the path resistance $R_{PATH}$, particularly in the worst case paths, without increasing stray capacitance or using appreciable quantities of silver ink, and (2) reducing the key cell open and closed capacitances while maintaining the ratio of closed to open capacitance at appropriate decodable levels.

A detailed description of the application of the above principles for the practice of this invention can now be explained by way of an illustrative example. The first step in the design of a capacitance switchcore with circuits printed with a high resistivity ink is to determine a maximum allowable time delay between the drive pulse at time $T_D$ and the sampling at time $T_S$. Because of leakage currents in the decoding circuitry and small capacitance values involved, waiting too long could introduce drift error. Also, in most applications it is desired to sample the key cells as rapidly as possible. A delay for $T_S$ of approximately 21 microseconds (uS) is satisfactory.

The next step is to determine the largest value for the RC time constant that will permit sampling at the desired $T_S$ time. Usually, a $T_S$ time period equal to two RC time constants is sufficient for producing a detectable voltage on the reference capacitor $C_{REF}$, so that the RC time constant should not exceed 10.5 uS. The maximum (worst case for closed key cell) stray capacitance $C_{STRAY}$ can be approximated as the closed key cell capacitance for a single key cell ($C_{CLOSED}$) times the number of key cells simultaneously actuated. Assuming eight key cells simultaneously closed, for example:

$$10.5 \; uS = R_{PATH} \times 8 C_{CLOSED}, \text{ or}$$

$$R_{PATH} \times C_{CLOSED} = 1.3 \; uS$$

It should be understood in the above equations that $R_{PATH}$ refers to the highest resistance, or worst case path. Before applying design considerations for practice of this invention for reducing trace resistance, a worst case path for a capacitance membrane switchcore printed with high resistivity inks can be in the range of 200K ohms for $R_{PATH}$ and 22 picofarads (pF) for $C_{CLOSED}$. This yields a time constant of 4.4 uS, or approximately 3.4 times longer than desired. The above cited value of 22 pF for $C_{CLOSED}$ is as small a value as is practical, since any further reduction in $C_{CLOSED}$ would require even more stringent control of the open key cell capacitance and other stray capacitances. Also, the key cell capacitances are primarily determined by the key cell geometry rather than the composition of the ink used to print them. Therefore, reducing the $R_{PATH}$-$C_{STRAY}$ time constant should be accomplished by controlling or adjusting the trace resistance. Important teachings for the practice of this invention include tee below described techniques for trace design, particularly worst case traces, specifically:

(i) Trace resistance can be controlled to a significant extent by design of the cross-sectional area of a trace, i.e. thickness and width, such as by increasing cross-sectional area to obtain a manageable path resistance. A practical limit on the thickness of traces of approximately 0.35 mils is imposed by printing techniques and the requirements for line definition, trace separation, etc. Therefore, any significant increase in cross-sectional area must come from an increase in width. Traces printed with carbon inks can be formed substantially wider than traces printed with silver inks, although layout considerations limit the available width in congested areas. However, traces cannot be widened arbitrarily, since overlap between traces must be avoided to minimize stray capacitance, and an extremely limited area is available for trace routing in large membrane switchcores. Further, wide traces alone, if printed with uniform width, are not always practical, as cross-overs between traces would suffer increased stray capacitance. Because of the general layout of the trace layers in rows on one surface and columns on the opposite surface, multiple cross-over points exist between the traces on opposite sides of the dielectric. A parasitic, or stray capacitance is unavoidably formed at each such cross-over point. If the traces are made wide in order to reduce their resistance, then the cross-over capacitances are similarly large. It is generally known in the art that trace width can be reduced at cross-over points to reduce stray capacitance. However, in a capacitance switchcore made according to this invention, the ratio of nominal trace width to the trace width at a cross-over point should be increased substantially over that known for switchcores printed with silver inks. Therefore, one technique facilitating practice of this invention for reducing trace resistance without substantially increasing stray capacitance is to provide much more pronounced reductions in trace width, referred to as a "neck down", in the vicinity of cross-over points, such as shown in connection with switchcore 12 described above. Carbon inks, for example, can be reliably printed in more narrow widths than silver inks. If necessary for reduction of stray capacitance, the necked down portion in carbon ink traces can be printed as narrow as 15 mils, whereas a limit of 20 mils is the generally accepted minimum for silver ink traces. As a result, a necked down portion of a trace in a switchcore according to this invention may comprise a ratio of the nominal trace width to the trace width at a cross-over point of at least 4:1, and as high as 10:1 or more. Stray capacitance can be further reduced by ensuring that the necked-down portions cross at right angles to minimize the area of overlap. Furthermore, in any given switchcore application, a fixed area is available for routing of traces. Allocation of that area is much more critical in a switchcore printed with high resistivity inks according to this invention. Accordingly, the available area should be allocated selectively by (a) identifying the worst case paths, i.e. those paths covering the greatest distance and leading to the farthest key cells, and (b) utilizing available area to widen the worst case paths to achieve a reduction in the resistance of each of those paths. For example, in the embodiment of FIGS. 4 and 5, an exemplary layout mandates that trace 20 (FIG. 4) run around the periphery of the membrane to service key cells back towards the center of the switchcore. Shorter paths (e.g. non-worst cases) will still have relatively high resistance, but not nearly so high a resistance as the worst case paths. A large disparity between the best (lowest) and worst (largest) path resistances is detrimental in that the decoding parameters would vary widely between paths. It is therefore desirable to achieve a uniformity between the various path resistances, preferably by reducing the resistance of the worst case paths. Therefore trace 20 is made proportionately wider than other non-worst case traces. Similarly, trace 21 connects to the farthest key cells from the tail 36 and presents another worst case path; it also is widened to control its trace resistance. These measures result in a balance, or trade-off, in path resistance at a more uniform value, i.e. such that no path resistance is higher than an acceptable given value, for example 60K ohms. In that way, the worst case $R_{PATH}$-$C_{STRAY}$ time constant is maintained approximately at the desired 1.3 uS value.

(ii) The effective trace resistance also can be managed by reducing trace length. The use of intratrace capacitive coupling is an especially useful technique for reducing trace length, particularly for the longest, or worst case lengths. In some layouts of full alphanumeric keyboards, it is necessary to run a trace completely around the periphery of the membrane to connect to certain key cell locations. Using intratrace capacitive coupling, the same key cell locations can be serviced by much shorter traces, thereby freeing up additional peripheral area for use in widening other worst case traces.

In summary, then, circuit design techniques to be considered when laying out a specific large membrane capacitance switchcore having high resistance circuits printed with high resistivity inks in accordance with this invention include:

(1) Enlarging cross sectional area of the traces where feasible to reduce path resistance;

(2) Reduce trace width at cross-over points to reduce stray capacitance;

(3) Crossing a trace on one layer with a trace on another layer at right angles at necked down cross-over points;

(4) Reducing key cell open and closed capacitances, but controlling the ratio of closed to open capacitance at a decodable level; and (5) Reducing the length of worst case traces, such as through the use of intratrace capacitive coupling.

The development work culminating in this invention has demonstrated that large size capacitance membrane switchcores having circuits printed with high resistivity inks can be designed with an RC time constant such that the switchcore is decodable with low cost electronic components; application of the invention for a specific switchcore can involve attention to one or more of the above design techniques, particularly for worst case trace paths.

Figure 14:
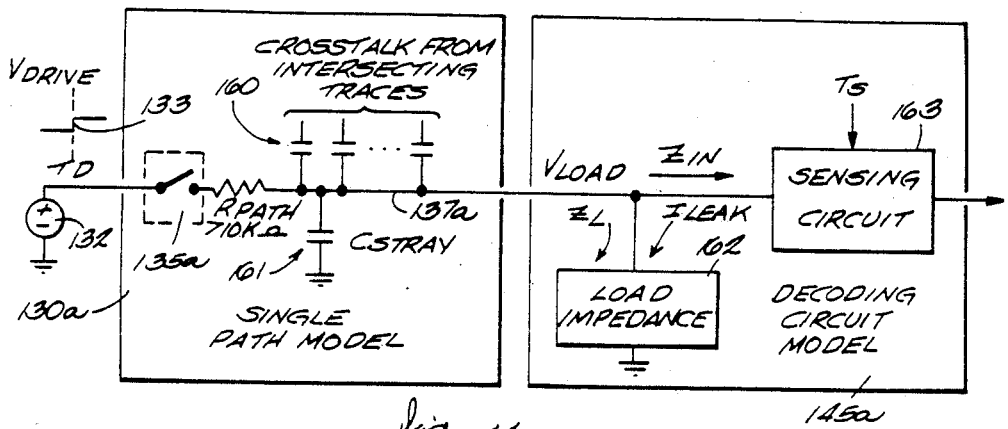
FIG. 14 is a block diagram of a contact switchcore of the invention.

Referring now to FIG. 14, the problems associated with a contact membrane switchcore having circuits printed with high resistivity inks are necessarily different than those described above in relation to capacitance switchcores because of the absence of individual key cell capacitors to be decoded. Contact switchcores comprise only a contact switch at each crosspoint in the matrix and are usually DC coupled to the decoding circuit, although some types of prior contact switchcores include a single series capacitor at the end of each row, the latter being shown in U.S. Pat. No. 4,367,385. Even though the effects of high trace resistance are different in a contact switchcore, the use of circuits printed with carbon or similar high resistivity inks in prior full alphanumeric or large size contact switchcores has proven to be equally disdained. The teachings of this invention described above are equally applicable in addressing the problems associated with contact switchcores, i.e. for controlling trace resistance at manageable but high levels.

In FIG. 14, a single path model 130a for a contact switchcore includes a contact switch key cell 135a in series with a path resistance $R_{PATH}$. As with the capacitance switchcore of FIG. 13, a drive line 131 is connected to a voltage source 132 for producing a drive pulse 133 at a time $T_D$. Drive line 131 in model 130a represents a row or column trace of a contact switchcore, such as for example a first trace 106 of switchcore 100. The drive line 131 connects to one end of the $R_{PATH}$-contact switch 135a series pair, while the other end comprises a sense line 137a. Sense line 137a of this model represents a row or column trace of a contact switchcore, such as for example a second trace 116 of switchcore 100 when drive connections are made to first traces 106 thereof. The sense line 137a is subjected to capacitive effects due to both crosstalk and stray capacitance, unavoidably formed between traces whenever traces on opposite sides of the insulating layer paths. The crosstalk capacitances represented at 160 originate from other drive and sense lines where they intersect the path of interest, and may introduce false signals onto sense line 137a when those other drive and sense lines are activated, e.g. pulsed. Stray capacitance represented at 161 also occurs between sense line 137a and the other drive and sense lines, except that is is manifested as a loss when the drive line 131 is pulsed, and so is represented separately for modeling purposes.

The sense line 137a is connected to a decoding circuit, modeled in block 145a. The decoding circuit model 145a includes a load impedance 162 having a value $Z_L$ connected between the sense line 137a and ground. A voltage $V_{LOAD}$ is developed across the load impedance 162, and is applied to the input of a sense circuit 163. The sense circuit 163 presents its own internal impedance $Z_{IN}$ to the voltage $V_{LOAD}$. The sense circuit 163 samples the voltage $V_{LOAD}$ at a time $T_S$, the time $T_S$ occurring an amount of time after time $T_D$ which allows the drive pulse 133 to propagate through the entire membrane path 130a.

The problems associated with high path resistances in a contact switchcore mainly stem from the way in which it is decoded. As previously mentioned, contact switchcores do not provide multiple key roll-over. Their popularity and widespread use, despite that disadvantage, is due to the fact that they can be simply decoded by direct connection to digital logic circuits because of their inherent DC coupling. In most cases, the sense circuit 163 comprises a direct logic input to a microprocessor which performs all of the keyboard decoding and communications functions. In prior contact switchcores, the value of the load impedance 162 is maintained at a very low value in order to minimize crosstalk and other noise effects and to provide adequate pull down, or current sink, for the logic input of the sensing circuit. Because of the low values of load impedance, an equally low path resistance was also required, mandating the use of high conductivity (or low resistivity) silver content inks. According to this invention, the switchcore is made with high resistivity inks, resulting in very high path resistances, so that the previously used low values of load impedance are wholly unsuitable. Therefore, this invention requires substantial increases in the load impedance $Z_L$ above that known in the prior art. However, there are limits on the extent to which the load impedance can be raised. First, a higher load impedance is generally more susceptible to the introduction of noise. Although there is no set level, it is generally preferred to keep the load impedance $Z_L$ as low as possible, which is one reason why carbon inks have not previously been used. One teaching of this invention is that much higher load impedances can be used to enable the successful decoding of contact switchcores printed with carbon and similar high resistivity inks. A second factor limiting the load impedance $Z_L$ is the value of leakage current $I_{LEAK}$ produced by the sense circuit 163. The load impedance $Z_L$ must be low enough to provide sufficient pull down, or current sink, so that the leakage current $I_{LEAK}$ does not produce a logic "high" value across the load impedance.

The utilization of this invention for a particular contact switchcore can involve reducing the path resistance $R_{PATH}$ in the switchcore to a manageable but high level consistent with the use of carbon-based ink circuits, according to the design techniques described above in relation to a capacitance type switchcore. This can allow the load impedance to be selected as low as possible for a particular application. It should be understood that even though trace resistances can be reduced when utilizing carbon-based inks, the trace resistances will still be very high compared to those in prior full alphanumeric membrane switchcores printed with silver inks; the reductions referred to herein are understood to mean a reduction in trace resistance as much as possible consistent with the use of high resistivity inks such as carbon-based inks and the size constraints of a full alphanumeric keyboard. In that sense, whatever reductions in trace resistance that can be attained are beneficial, particularly in the longest, or worst case paths. As will be described below, stray capacitance is also a factor in a contact switchcore, although to a lesser extent, and so the above described techniques of reducing stray capacitance are equally applicable to contact switchcores.

Having designed the worst case path resistance $R_{PATH}$ to an acceptable level, an appropriate resistive load impedance $Z_L$ must be selected which will be substantially higher than with prior art switchcores due to the high values of $R_{PATH}$ in a switchcore of this invention. Assuming the sensing circuit 163 is a direct digital logic input, then the input characteristics of the sensing circuit will be determined by the logic family used. Appropriate selection of the logic family to be used is therefore also required, consistent with the desired path resistance $R_{PATH}$ and load impedance $Z_L$. Logic families can be characterized by their input thresholds, input impedance, and leakage current. Transistor-Transistor Logic (TTL) has asymmetrical input thresholds, a low input impedance, and high leakage current; as a practical matter, $Z_L$ is too low and would draw more current than the high resistance switchcore could conduct so that TTL is not useful with a switchcore of the invention. N-channel Metal Oxide Semiconductor (NMOS) logic has approximately the same input thresholds as TTL but has a fairly high input impedance and a fairly low leakage current. The higher input impedance of NMOS logic can be driven through $R_{PATH}$ source resistance of 10k to 50k ohms, but the load impedance should be increased to at least the value of $R_{PATH}$. Complementary Metal Oxide Semiconductor (CMOS) logic has extremely high input impedance, very low leakage, and symmetrical input thresholds. As a result, CMOS logic is preferred for decoding switchcores printed with high resistivity inks. As a general rule with CMOS logic, the load impedance $Z_L$ is resistive, with a value of approximately five times the worst case path resistance $R_{PATH}$. In that case, 5/6 or about 83% of the drive voltage appears across the load impedance. As a specific example, if the worst case path resistance $R_{PATH}$ is 200K ohms, then $Z_L$ should be 1M ohm (M=1,000,000). Such an extremely high value for the load impedance $Z_L$ is unprecedented in prior full alphanumeric contact switchcores, and is mandated only by the high resistance circuits resulting from this invention. In other cases, the path resistance and load impedance may be so high that CMOS devices only from particular manufacturers may be suitable as specifications may vary between manufacturers, particularly for leakage current $I_{LEAK}$, and it may be necessary to use only devices with suitable specifications. In the above example of a 1M ohm load impedance, the leakage current $I_{LEAK}$ must be below approximately 1.0 microamps (uA), resulting in less than a 1 volt bias on the input which is well below the approximately 1.5 volt minimum threshold for COS logic (assuming a five volt logic supply).

The above discussion of the path resistance in relation to decoding is the primary factor affecting the use of high resistance circuits in a large contact membrane switchcore. Other factors relating to the effects of stray capacitance are also important, albeit to a lesser extent. Since a contact switchcore is usually DC coupled, and the effects of stray capacitance are transitory; those effects can be mitigated by waiting long enough before sampling to ensure that they have died out. Nevertheless, it is not desirable to wait excessively long for each sample, and so control of stray capacitance is still important.

Figure 15:
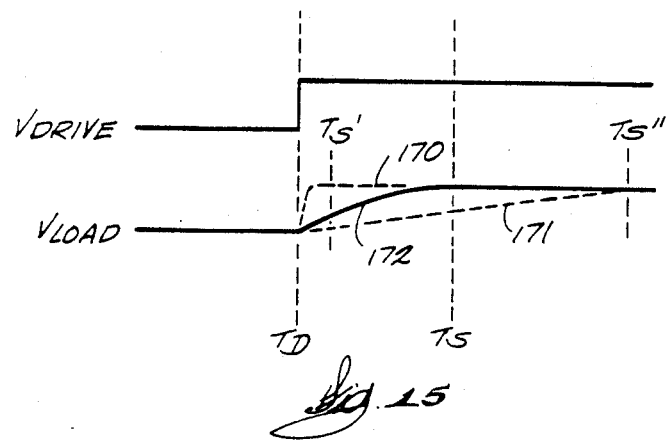
FIG. 15 is a timing diagram for the switchcore of FIG. 14.

Referring to FIG. 15, when the drive pulse 133 occurs at time $T_D$, the voltage $V_{LOAD}$ on sense line 137a begins to rise at a rate determined by the RC time constant formed by the path resistance $R_{PATH}$ and the stray capacitance 161. In prior contact switchcores, the low path resistances resulting from the use of silver inks produced a relatively fast rise time as represented by the dotted line 170, which could then be sampled at a much earlier time $T_S'$, despite relatively high values of stray capacitances 161. In other words, stray capacitance is much less of a problem when silver inks are used. Conversely, with carbon-based inks, the effects of stray capacitance are much more prevalent and must be addressed. The inability of those skilled in the art to deal with this problem has been a primary factor in the continued use of silver inks. If high resistivity inks are used without decreasing the stray capacitance 161 in accordance with this invention, then a very slow rise time results as represented by dotted line 171, which does not become valid until a time $T_S''$, resulting in excessive delay.

Useful application of this invention, therefore, requires that the response time, or RC time constant, defined by the path resistance and the stray capacitance, must be considered and generally reduced when using high resistivity inks. This is accomplished by reducing the trace resistance or stray capacitance, or preferably, both, using the circuit design techniques described with reference to capacitance switchcores. With the appropriate reduction in the RC time constant, the response time of the model 130a can be reduced to the solid line 172 of FIG. 14, becoming valid at time $T_S$. The time $T_S$ achievable with this invention, albeit longer than the time $T_S'$, is still short enough to permit complete sampling of a full alphanumeric keyboard in less than the approximate 10 mS sampling period typically required.

Yet another technique useful in the practice of this invention for reducing the response time of a contact switchcore is to reduce stray capacitance by avoiding overlapping traces between traces on opposite sides of the dielectric or spacer layer, especially on long trace runs. In prior silver printed switchcores, trace runs can be laid out with minimal regard for stray capacitance effects due to the very low value of the load impedance. As a result, the prior switchcores commonly included long, straight trace runs on each side of an insulating layer. Traces on both sides of the insulating layer were overlapped for convenience in laying out the traces on each separate side. Since the traces were separated by an insulator, there was no contact, but substantial stray capacitance was present. Such overlap between trace runs is preferably avoided in a membrane switchcore with high resistance circuits of this invention to reduce stray capacitance; thus, traces, especially long straight runs, on opposite trace layers can be staggered so that there is minimal overlap between traces, thereby reducing stray capacitance.

There has been described above several preferred embodiments of the invention in a capacitance switchcore and a contact switchcore, together with the relevant teachings, which enable the use of low cost, high resistivity inks, such as carbon-based inks, in fabricating full alphanumeric membrane switchcores. Switchcores of this invention differ markedly from prior art large alphanumeric membrane switchcores in that they have conductive key cell elements and traces connected to the key cell elements that are made of high resistivity ink having a resistivity of at least about 10 ohms per square per 0.001" of ink thickness and have at least one path including key cell elements and row and column traces having a path resistance greater than about 10,000 ohms. That is, alphanumeric membrane switchcores of this invention include conductive key cell elements and traces connected to the key cell elements so as to form conductive paths between the drive and sense connections to the switchcore, and the key cell elements and traces define circuits along opposite surfaces of an insulating layer and are made of high resistivity ink having a resistivity of at least about 10 ohms per square per 0.001" of ink thickness and wherein at least one conductive path for the transmission of electrical signals across the switchcore between drive and sense connections thereto has a path resistance greater than 10,000 ohms. None of the prior art membrane switchcores have, it is believed, incorporated high resistivity ink circuits possessing the foregoing characteristics of the switchcores of this invention. The invention exemplifies a renaissance in membrane switchcore technology by eliminating the dependence on high cost silver based inks, together with the additional processing steps necessitated by the use thereof.

It should be apparent to those skilled in the art that the application of this invention, e.g. a full alphanumeric keyboard employing traces and key cell elements printed with a low cost, high resistivity ink, in other specific switchcore designs may selectively employ the teachings set out above either in whole or in part. Thus, the foregoing enabling description of this invention, sets forth several exemplary constructions of large size membrane switchcores incorporating the concepts of my invention, but it will be apparent to those of ordinary skill in the art that the exemplary embodiments can be modified in various ways and yet result in a switchcore within the scope of this invention; it is therefore intended that the appended claims encompass all modifications of the disclosed embodiments that are within the true spirit and scope of the invention.

I claim:

1. A membrane switchcore of flexible plastic film for use in an alphanumeric keyboard and adapted for connection to electronic device circuitry for transmitting an electrical signal to the switchcore and electronic sense circuitry for detecting a change in the electrical signal transmitted across the switchcore, comprising:
   an insulating layer;
   a plurality of conductive row traces along a first surface of the insulating layer;
   a plurality of conductive column traces along a second surface of the insulating layer opposite the first surface;
   at least 36 key cells, each key cell being connected between one of said row conductive traces on the first surface and one of said column conductive traces on the second surface, and each key cell including conductive key cell elements for effecting a change in impedance between drive and sense connections to the row and column traces in response to manual actuation of the key cell; and
   the row traces, the column traces, and the key cell elements define paths for the transmission of electrical signals between drive and sense connections to the switchcore and are formed of a conductive high resistivity ink having a resistivity of at least about 10 ohms per square per 0.001" of ink thickness, and wherein the net resistance for one of the row traces and one of the column traces in at least one said path defined by said one row trace, said one column trace, and one of the key cells connected to said one row trace and one column trace is greater than approximately 5,000 ohms for each of said one row trace and said one column trace.

2. A membrane switchcore according to claim 1 in which the switchcore is decodable at a scanning rate of about 10 milliseconds or less.

3. A membrane switchcore according to claim 1 in which the high resistivity ink is a carbon-based ink.

4. A membrane switchcore according to any one of claims 1-3 in which the key cell elements are of the contact type and actuation of a key cell causes a change in resistance decodable by sense circuitry combined with the membrane switchcore.

5. A membrane switchcore according to any one of claims 1-3 in which the key cell elements are of the capacitance type and actuation of a key cell causes a change in net capacitance decodable by sense circuitry combined with the membrane switchcore.

* * * * *